United States Patent
Yoshikawa et al.

(10) Patent No.: US 10,636,833 B2
(45) Date of Patent: Apr. 28, 2020

(54) QUANTUM DOT INFRARED DETECTOR

(71) Applicants: SHARP KABUSHIKI KAISHA, Sakai, Osaka (JP); The University of Tokyo, Tokyo (JP)

(72) Inventors: Hirofumi Yoshikawa, Sakai (JP); Yasuhiko Arakawa, Tokyo (JP)

(73) Assignees: SHARP KABUSHIKI KAISHA, Sakai, Osaka (JP); The University of Tokyo, Tokyo (JP)

( * ) Notice: Subject to any disclaimer, the term of this patent is extended or adjusted under 35 U.S.C. 154(b) by 0 days.

(21) Appl. No.: 16/120,798

(22) Filed: Sep. 4, 2018

(65) Prior Publication Data

US 2019/0074320 A1    Mar. 7, 2019

(30) Foreign Application Priority Data

Sep. 4, 2017 (JP) .................................. 2017-169697

(51) Int. Cl.
*H01L 27/146* (2006.01)
*H01L 31/0352* (2006.01)
(Continued)

(52) U.S. Cl.
CPC .. *H01L 27/14652* (2013.01); *H01L 31/03046* (2013.01); *H01L 31/03845* (2013.01);
(Continued)

(58) Field of Classification Search
CPC ..... H01L 31/035218; H01L 31/035236; H01L 27/14652
See application file for complete search history.

(56) References Cited

U.S. PATENT DOCUMENTS

2001/0028055 A1    10/2001    Fafard et al.
2010/0032552 A1*    2/2010    Doshida ................. B82Y 20/00
                                                     250/225
(Continued)

FOREIGN PATENT DOCUMENTS

JP    2016-136585 A    7/2016
JP    5976141    *    8/2016
WO    2011-050165 A2    4/2011

OTHER PUBLICATIONS

Mitin et al. Nanoscale Res Lett 2011, 6:21 (Year: 2011).*
(Continued)

*Primary Examiner* — Cuong Q Nguyen
*Assistant Examiner* — Shih Tsun A Chou
(74) *Attorney, Agent, or Firm* — ScienBiziP, P.C.

(57) ABSTRACT

A quantum dot infrared detector includes a quantum dot-stacked structure in which quantum dot layers each containing quantum dots stacked on top of one another and intermediate layers. The quantum dots are sandwiched between the intermediate layers in the height direction of the quantum dots. The quantum dots have conduction band quantum confinement levels that include a conduction band ground level, a conduction band first excitation level at a higher energy position than the conduction band ground level, and a conduction band second excitation level at a higher energy position than the conduction band ground level. An energy gap between the conduction band first excitation level and the conduction band bottom of the intermediate layer and an energy gap between the conduction band second excitation level and the conduction band bottom of the intermediate layer are each smaller than twice thermal energy.

6 Claims, 7 Drawing Sheets

(51) Int. Cl.
  H01L 31/09 (2006.01)
  H01L 31/0384 (2006.01)
  H01L 31/0304 (2006.01)
  H01L 31/109 (2006.01)

(52) U.S. Cl.
  CPC ............ H01L 31/035218 (2013.01); H01L 31/035236 (2013.01); H01L 31/09 (2013.01); H01L 31/109 (2013.01)

(56) References Cited

U.S. PATENT DOCUMENTS

2010/0032652 A1   2/2010   Okamura et al.
2012/0205541 A1   8/2012   Lee et al.
2012/0285537 A1*  11/2012  Yoshikawa ............ B82Y 20/00
                                                      136/262

OTHER PUBLICATIONS

Nextnano, Dispersion in infinite superlattices: minibands, archived on Oct. 13, 2015 (https://web.archive.org/web/20151013035927/https://www.nextnano.de/nextnano3/tutorial/1Dtutorial14.htm) (Year: 2015).*

Mitsuhiro Nagashima et al., "Photodetection around 10 μm wavelength using s-p transitions in InAs/AIAs/AlGaAs self-assembled quantum dots", Journal of Applied Physics 107, 054504 (2010).

Jamie Phillips, "Evaluation of the fundamental properties of quantum dot infrared detectors", Journal of Applied Physics vol. 91, 4590 (2002).

Ariyawansa, G. et al., Bias-selectable tricolor tunneling quantum dot infrared photodetector for atmospheric windows, Applied Physics Letters, Mar. 19, 2008, vol. 92, pp. 111104-1-111104-3.

* cited by examiner k7:[1-10]
k8:[110]
k9:SUM k10:[1-10]
k11:[110]
k12:SUM

QUANTUM DOT INFRARED DETECTOR

BACKGROUND

1. Field

The present disclosure relates to a quantum dot infrared detector.

2. Description of the Related Art

In the field of infrared detectors, infrared detectors having quantum dots have been under research and development for the purpose of increasing sensitivity. For example, quantum dot infrared detectors having high sensitivity in the mid- and far-infrared regions are provided by using transitions between quantum levels of the conduction band in the structure containing quantum dots in the active layer, as described in Japanese Unexamined Patent Application Publication No. 2016-136585 (Patent Literature 1) and Mitsuhiro Nagashima, Michiya Kibe, Minoru Doshida, Yasuhito Uchiyama, Yusuke Matsukura, and Hironori Nishino, "photodetection around 10 μm wavelength using s-p transitions in InAs/AlAs/AlGaAs self-assembled quantum dots," JOURNAL OF APPLIED PHYSICS 107, 054504 (2010) (Non-Patent Literature 1).

Quantum dot infrared detectors are different from existing thermal-type detectors, such as bolometers, and quantum-type detectors including, for example, bulk InGaAs or MCT (HgCdTe) in that quantum dot infrared detectors have a sharp absorption band rather than a broad absorption band. Such a sharp absorption band is generated by using energy levels discretized by the quantum confinement effect.

Current quantum dot infrared detectors are associated with light absorption using transitions from the ground level of the conduction band to the quantum levels of the quantum well layer and the conduction band in an intermediate layer, typically with the detection band being often not greater than 8 μm.

The transition wavelength at which the transition from the ground level to the first excitation level (and the second excitation level) of the conduction band occurs is in a longer wavelength range than the above-described band. For an InAs/GaAs quantum dot structure in which GaAs is used in the underlayer and the partial capping layer for the quantum dots, the transition wavelength is typically from 20 to 25 μm. In the case of using an infrared detector, however, it is desirable to detect light in the 8-14 m band (atmospheric window), where there is little atmospheric absorption.

Non-Patent Literature 1 discloses a quantum dot structure including an intermediate layer ($Al_xGa_{1-x}As$, x=0.15 to 0.20) having a wider energy gap than quantum dots and a barrier layer (AlAs) having a wider energy gap than the intermediate layer. Photodetection in the 8-14 μm band is realized by the transition between a conduction band ground level $e_0$ and a conduction band first excitation level $e_1$ and the transition between the conduction band ground level $e_0$ and a conduction band second excitation level $e_2$.

A structure having one conduction band quantum confinement level is disclosed in Jamie Phillips, "Evaluation of the fundamental properties of quantum dot infrared detectors," JOURNAL OF APPLIED PHYSICS VOLUME 91, 4590 (2002) (Non-Patent Literature 2).

The quantum dot structure described in Non-Patent Literature 1, however, exhibits a large half-width of the detection band due to the in-plane anisotropy of the quantum dots at the transition between the conduction band ground level $e_0$ and the conduction band first excitation level $e_1$ and the transition between the conduction band ground level $e_0$ and the conduction band second excitation level $e_2$.

SUMMARY

According to embodiments of the present disclosure, there are provided quantum dot infrared detectors that offer a small half-width for photodetection in the 8-14 μm band.

Structure 1

According to an embodiment of the present disclosure, a quantum dot infrared detector includes a quantum dot-stacked structure that includes quantum dot layers stacked on top of one another and each including quantum dots and an intermediate layer. The quantum dots have conduction band quantum confinement levels that include a conduction band ground level, a conduction band first excitation level at a higher energy position than the conduction band ground level, and a conduction band second excitation level at a higher energy position than the conduction band ground level. An energy gap between the conduction band first excitation level and a conduction band bottom of the intermediate layer and an energy gap between the conduction band second excitation level and the conduction band bottom of the intermediate layer are each smaller than twice thermal energy. The conduction band ground level and the conduction band first excitation level are discrete levels.

Structure 2

According to an embodiment of the present disclosure, a quantum dot infrared detector includes a quantum dot-stacked structure that includes quantum dot layers stacked on top of one another and each including quantum dots. The quantum dots have conduction band quantum confinement levels that include a conduction band ground level, and a conduction band first excitation level, a conduction band second excitation level, and a conduction band third excitation level each at a higher energy position than the conduction band ground level. An energy gap between the conduction band second excitation level and the conduction band third excitation level is smaller than thermal energy. The conduction band ground level and the conduction band first excitation level are discrete levels.

Structure 3

According to an embodiment of the present disclosure, a quantum dot infrared detector includes a quantum dot-stacked structure that includes quantum dot layers stacked on top of one another and each including quantum dots. The quantum dots have conduction band quantum confinement levels that include a conduction band ground level and a conduction band first excitation level at a higher energy level than the conduction band ground level. The conduction band ground level and the conduction band first excitation level are discrete levels. An emission spectrum detected as a result of incidence of an electromagnetic wave on or injection of a current into the quantum dot infrared detector includes a separated single peak and a peak group including successive peaks; an energy gap between the separated single peak and the peak group is larger than thermal energy; and an energy gap between the peaks in the peak group is smaller than thermal energy.

DESCRIPTION OF THE EMBODIMENTS

Figure 1:
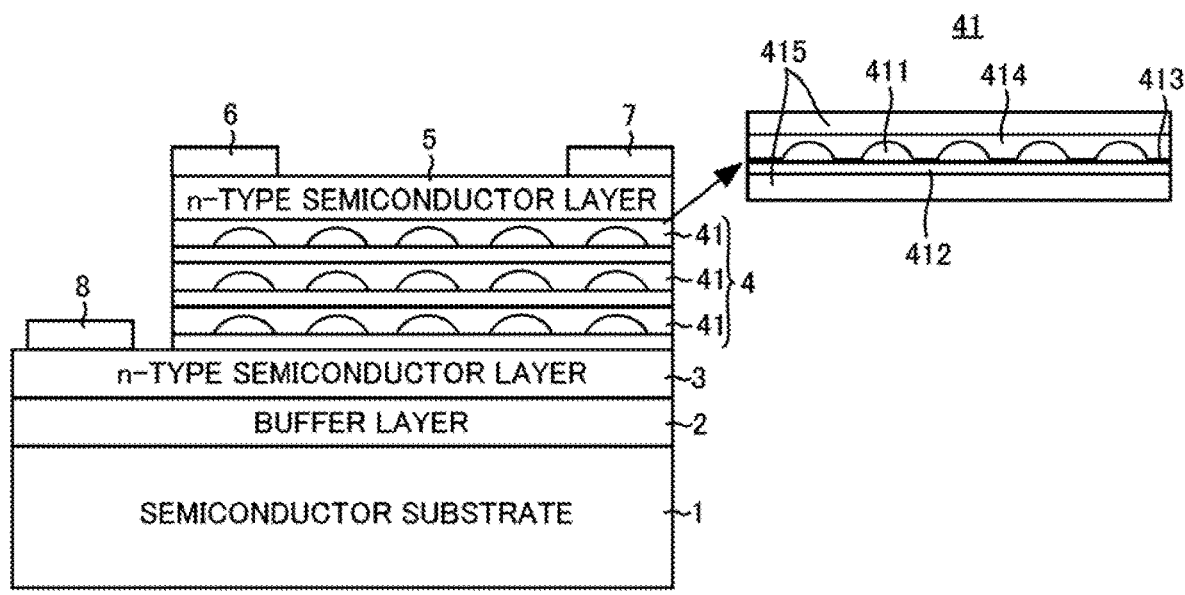
FIG. 1 is a sectional view of a quantum dot infrared detector according to an embodiment of the present disclosure.

Embodiments of the present disclosure will be described in detail with reference to the drawings. It is noted that the same parts or corresponding parts in the drawings are denoted by the same reference characters, and the description thereof is not repeated.

The terms used in this specification will be described here.

The term "quantum dot layer" refers to a layer including quantum dots, a wetting layer, an intermediate layer, an underlayer for the quantum dots, a partial capping layer for the quantum dots, an insertion layer, and the like.

The term "quantum dot" refers to a semiconductor fine particle that has a particle size of 100 nm or less and is covered with a semiconductor material having a larger bandgap than the semiconductor material constituting the quantum dot. In Stranski-Krastanov (S-K) growth, a wetting layer is formed, and quantum dots are then grown.

The term "underlayer for the quantum dots" refers to an underlayer for growing quantum dots and a wetting layer. The underlayer is formed of a semiconductor material having a larger band gap than the semiconductor material constituting the quantum dots.

The term "partial capping layer for the quantum dots" refers to a layer grown on the quantum dots. The partial capping layer is formed of a semiconductor material having a larger bandgap than the semiconductor material constituting the quantum dots and at least partially covers the quantum dots. In FIG. 1 described below, the partial capping layer is flat. The partial capping layer may be shaped in conformance with the shape of the quantum dots. In FIG. 1, the partial capping layer has a thickness larger than or equal to the height of the quantum dots. The thickness may be smaller than or equal to the height of the quantum dots.

The term "intermediate layer" refers to a layer serving as a matrix of the quantum dot layer and formed of a semiconductor material having a larger bandgap than the semiconductor material constituting the quantum dots. The intermediate layer may be formed of the same semiconductor material as the underlayer for the quantum dots and the partial capping layer for the quantum dots.

FIG. 1 is a sectional view of a quantum dot infrared detector according to an embodiment of the present disclosure. Referring to FIG. 1, a quantum dot infrared detector 10 according to an embodiment of the present disclosure includes a semiconductor substrate 1, a buffer layer 2, n-type semiconductor layers 3 and 5, a photoelectric conversion layer 4, and electrodes 6 to 8.

The buffer layer 2 is disposed on the semiconductor substrate 1 and in contact with one surface of the semiconductor substrate 1. The n-type semiconductor layer 3 is disposed on the buffer layer 2 and in contact with the buffer layer 2.

The photoelectric conversion layer 4 is disposed on the n-type semiconductor layer 3 and in contact with the n-type semiconductor layer 3. The n-type semiconductor layer 5 is disposed on the photoelectric conversion layer 4 and in contact with the photoelectric conversion layer 4.

The electrodes 6 and 7 are distant from each other and disposed on the n-type semiconductor layer 5 and in contact with the n-type semiconductor layer 5. The electrode 8 is disposed on the n-type semiconductor layer 3 and in contact with the n-type semiconductor layer 3.

The semiconductor substrate 1 is formed of, for example, semi-insulating GaAs. The buffer layer 2 is formed of, for example, GaAs. The buffer layer 2 has a thickness of, for example, 100 nm to 500 nm.

The n-type semiconductor layers 3 and 5 are each formed of, for example, n-GaAs. The n-type semiconductor layers 3 and 5 each have a thickness of, for example, 100 nm to 1000 nm.

The electrodes 6 to 8 are n-type electrodes and formed of, for example, any one of Au/AuGeNi, AuGe/Ni/Au, Au/Ge, and Au/Ge/Ni/Au. The electrodes 6 to 8 each have a thickness of, for example, 10 nm to 500 nm.

The photoelectric conversion layer 4 has a stacked structure in which quantum dot layers 41 are stacked on top of one another. FIG. 1 depicts the case where three quantum dot layers 41 are stacked on top of one another. In the quantum dot infrared detector 10, two or more quantum dot layers 41 are stacked on top of one another.

The quantum dot layers 41 each include quantum dots 411, an underlayer 412 for the quantum dots 411, a wetting layer 413 for the quantum dots 411, a partial capping layer 414 for the quantum dots 411, and an intermediate layer 415.

The underlayer 412 is disposed under the quantum dots 411. The wetting layer 413 is disposed on the underlayer 412 and in contact with the underlayer 412. In the stacking direction of the quantum dot layers 41, the intermediate layer 415 is disposed on each side of a group including the quantum dots 411, the underlayer 412, and the wetting layer 413.

The quantum dot layer 41 may include an insertion layer and the like in addition to the quantum dots 411, the underlayer 412 for the quantum dots, the wetting layer 413, the partial capping layer 414 for the quantum dots 411, and the intermediate layer 415.

The quantum dot layer 41 typically includes at least the quantum dots 411, the underlayer 412 for the quantum dots 411, the partial capping layer 414 for the quantum dots 411, and the intermediate layer 415.

The material of the quantum dot layers 41 is not limited and may be a group III-V compound semiconductor.

The quantum dots 411 may be formed of a semiconductor material having a smaller bandgap energy than that of the intermediate layer 415.

The material of the quantum dot layers 41 may be for example, any one of $GaAs_xSb_{1-x}$, AlSb, $InAs_xSb_{1-x}$, $Ga_xIn_{1-x}Sb$, $AlSb_xAs_{1-x}$, $AlAs_zSb_{1-z}$, $In_xGa_{1-x}As$, $Al_xGa_{1-x}As$, $Al_yGa_{1-y}As_zSb_{1-z}$, $In_xGa_{1-x}P$, $(Al_yGa_{1-y})_zIn_{1-z}P$, $GaAs_xP_{1-x}$, $Ga_yIn_{1-y}As_zP_{1-z}$, and $In_xAl_{1-x}As$ (in these materials, $0≤x≤1$, $0≤y≤1$, and $0≤z≤1$, the same applies to the following description) or may be a mixed crystal material thereof.

The material of the quantum dot layers 41 may be a compound semiconductor composed of a group IV semiconductor or a group III semiconductor material and a group V semiconductor material, or a compound semiconductor composed of a group II semiconductor material and a group VI semiconductor material, or may be a mixed crystal material thereof. These groups are listed in the periodic table. The material of the quantum dot layers 41 may be a chalcopyrite-based material or may be a semiconductor other than chalcopyrite-based materials.

The photoelectric conversion layer 4 may be an i-type semiconductor layer or may be a semiconductor layer containing a p-type impurity or an n-type impurity.

In an embodiment of the present disclosure, the photoelectric conversion layer 4 has a quantum dot-stacked structure. The quantum dot-stacked structure includes at least the quantum dots 411, the underlayer 412 for the quantum dots 411, the partial capping layer 414 for the quantum dots 411, and the intermediate layer 415. The quantum dots 411, the underlayer 412, the partial capping layer 414, and the intermediate layer 415 are formed of, for example, the following materials.

The quantum dots 411 are formed of InAs. The underlayer 412 (also referred to as a "barrier layer". The same applies to the following description) is formed of $Al_{0.4}Ga_{0.6}As$. The partial capping layer 414 (also referred to as a "barrier layer". The same applies to the following description) is formed of $Al_{0.4}Ga_{0.6}As$. The intermediate layer 415 is formed of GaAs.

The underlayer 412 and the partial capping layer 414 have a thickness that allows for electron tunneling.

The intermediate layer 415, as described below, is formed of a material having a conduction band bottom located near a conduction band first excitation level and a conduction band second excitation level, which are formed in the quantum dots 411.

The partial capping layer 414 is not limited to $Al_{0.4}Ga_{0.6}As$, and the partial capping layer 414 is normally formed of $Al_xGa_{1-x}As$ ($0<x≤1$). When the partial capping layer 414 (barrier layer) is formed of AlGaAs, it is easy to form, on the GaAs substrate, the partial capping layer 414 (barrier layer) having a larger band gap than GaAs.

The partial capping layer 414 (barrier layer) may be formed of InGaP or GaAsP.

Since the intermediate layer 415 is a thick layer, crystal quality is taken into consideration. In the case of the AlGaAs layer, the crystal quality increases with decreasing Al content. The crystal quality of the intermediate layer 415 can thus be improved by using GaAs as a material of the intermediate layer 415.

Figure 2A:
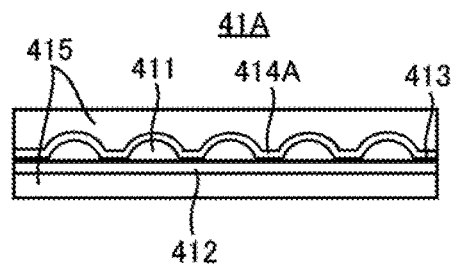
FIGS. 2A and 2B are sectional views of other structures of the quantum dot layer illustrated in FIG. 1.
Figure 2B:
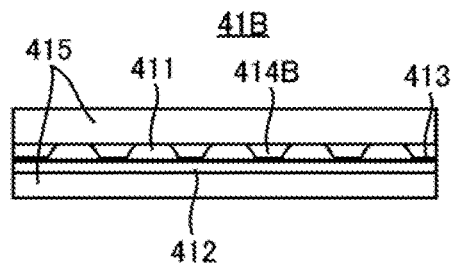

FIGS. 2A and 2B are sectional views of other structures of the quantum dot layer 41 illustrated in FIG. 1. The quantum dot layer 41 in an embodiment of the present disclosure may be a quantum dot layer 41A illustrated in FIG. 2A or may be a quantum dot layer 41B illustrated in FIG. 2B.

Referring to FIG. 2A, the quantum dot layer 41A is similar to the quantum dot layer 41 except that the partial capping layer 414 of the quantum dot layer 41 illustrated in FIG. 1 is replaced by the partial capping layer 414A.

The partial capping layer 414A is disposed on the quantum dots 411 and the wetting layer 413 and shaped in conformance with the shape of the quantum dots 411.

Referring to FIG. 2B, the quantum dot layer 41B is similar to the quantum dot layer 41 except that the partial capping layer 414 of the quantum dot layer 41 illustrated in FIG. 1 is replaced by the partial capping layer 414B.

The partial capping layer 414B has the same thickness as the quantum dots 411 and is disposed on the quantum dots 411 and the wetting layer 413.

In an embodiment of the present disclosure, the partial capping layer may be any one of the partial capping layer 414 illustrated in FIG. 1 and the partial capping layers 414A and 414B illustrated in FIG. 2.

FIGS. 3A to 3E are views of a first process in a method for producing the quantum dot infrared detector 10 illustrated in FIG. 1. FIGS. 4F and 4G are views of a second process in the method for producing the quantum dot infrared detector 10 illustrated in FIG. 1. Furthermore, step (a) to step (g) illustrated in FIGS. 3A to 4G illustrate a single process including the first and second processes.

Figure 3A:
FIGS. 3A to 3E are views of a first process in a method for producing the quantum dot infrared detector illustrated in FIG. 1.

Referring FIGS. 3A to 3E, the production of the quantum dot infrared detector 10 starts with the support of a semiconductor substrate 1 formed of semi-insulating GaAs in a molecular beam epitaxy (MBE) apparatus (step (a) in FIG. 3A).

Figure 3B:
Figure 4F:
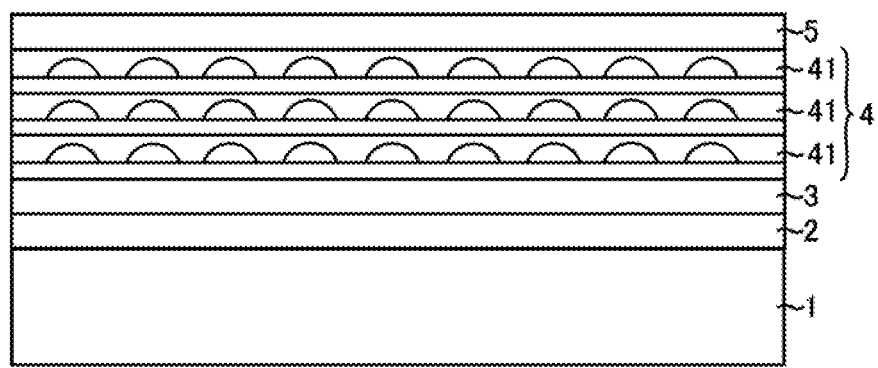
FIGS. 4F and 4G are views of a second process in the method for producing the quantum dot infrared detector illustrated in FIG. 1.
Figure 4G:
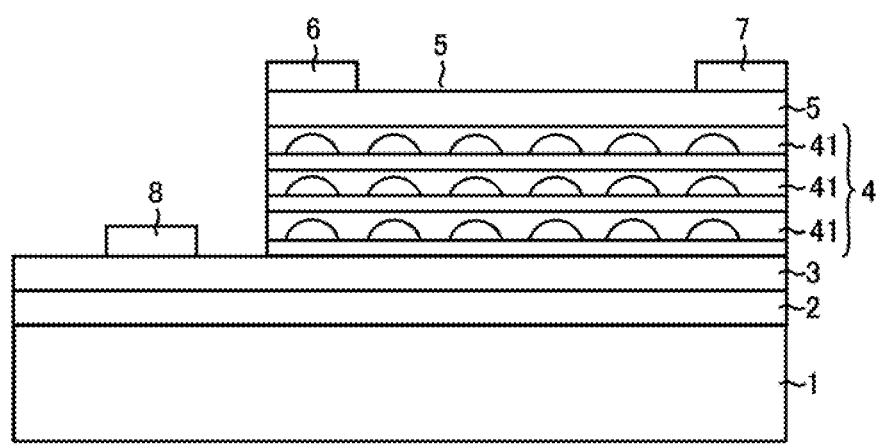

A buffer layer 2 is then formed on the semiconductor substrate 1 by using MBE (step (b) in FIG. 3B). In this case, for example, a GaAs layer 200 nm thick is formed as the buffer layer 2. The formation of the buffer layer 2 can improve the crystallinity of a photoelectric conversion layer 4 to be formed above the buffer layer 2. As a result, an infrared detector in which the photoelectric conversion layer 4 has high light receiving efficiency can be provided.

Figure 3C:
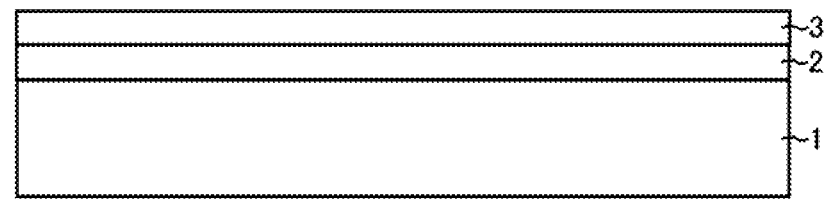

After the step (b), an n-type semiconductor layer 3 is formed on the buffer layer 2 by using MBE (step (c) in FIG. 3C). In this case, for example, an n-GaAs layer of 500 nm is formed as the n-type semiconductor layer 3.

Figure 3D:
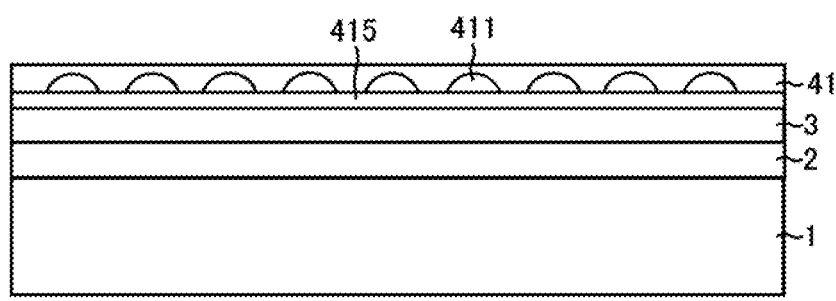

Subsequently, a quantum dot layer 41 including quantum dots 411 and an intermediate layer 415 is formed on the n-type semiconductor layer 3 by using MBE (step (d) in FIG. 3D).

In this case, the quantum dots 411 are formed by a method called Stranski-Krastanov (S-K) growth.

More specifically, a GaAs layer is crystal-grown as the intermediate layer 415, and an $Al_{0.4}Ga_{0.6}As$ layer is then crystal-grown as an underlayer 412 (barrier layer) for the quantum dots 411. The quantum dots 411 made of InAs are formed through a self-assembly mechanism. An $Al_{0.4}Ga_{0.6}As$ layer is then crystal-grown as a partial capping layer 414 so that the quantum dots 411 are embedded in the partial capping layer 414. Furthermore, a GaAs layer is then crystal-grown as the intermediate layer to form the quantum dot layer 41.

Figure 3E:
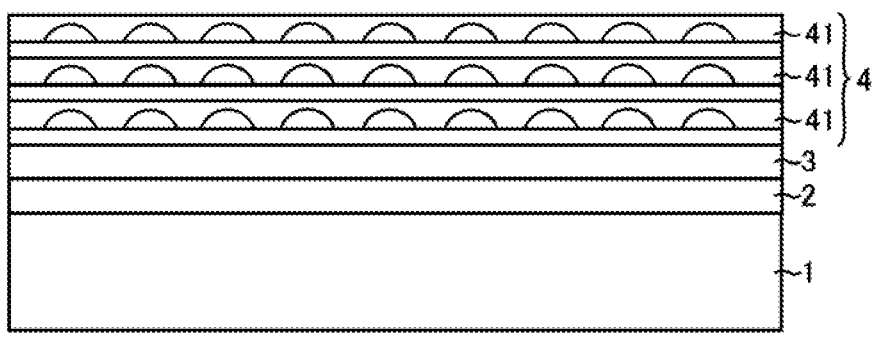

The step (d) is then repeated, for example, 10 times to form, on the n-type semiconductor layer 3, the photoelectric conversion layer 4 having a structure in which the quantum dot layers 41 are stacked on top of one another (step (e) in FIG. 3E).

The intermediate layer 415 is much thicker than the barrier layers (the underlayer 412 and the partial capping layer 414) and is, for example, 40 nm thick. The barrier layers (the underlayer 412 and the partial capping layer 414) may be thin in order that excited carriers tunnel into the intermediate layer 415. The barrier layers are, for example, 1 nm thick.

After the step (e) in FIG. 3E, the n-type semiconductor layer 5 is formed on the photoelectric conversion layer 4 by using MBE (step (f) in FIG. 4F). In this case, for example, an n-GaAs layer 200 nm thick is crystal-grown as the n-type semiconductor layer 5. As a result, a nin structure is formed.

Subsequently, the multilayer sample is taken out of the MBE apparatus, and the photoelectric conversion layer 4 and the n-type semiconductor layer 5 are partially removed by using photolithography and wet etching. Electrodes 6 and 7 are formed on the n-type semiconductor layer 5, and an electrode 8 is formed on the n-type semiconductor layer 3. A quantum dot infrared detector 10 is completed accordingly (step (g) in FIG. 4G).

In the production process described above, for example, Si can be used as an n-type dopant. Also, Au may be used for the electrodes 6 to 8, and the electrodes 6 to 8 may be formed by vacuum deposition using resistance-heating vacuum deposition.

When infrared light strikes the quantum dot infrared detector 10, electrons are excited by light absorption in the photoelectric conversion layer 4. The excited electrons move under an electric field and are obtained from the electrodes 6 to 8 as a photocurrent.

Using AlGaAs in the underlayer 412 and the partial capping layer 414 for the quantum dots 411 can improve the surface flatness of the underlayer 412 and the partial capping layer 414 while providing the quantum confinement effect of the quantum dots, and can provide the quantum dot infrared detector 10 that includes a large number of the quantum dot layers 41 but in which dislocations or the like are unlikely to occur.

In the quantum dot infrared detector 10, the transition between the conduction band ground level $e_0$ and the conduction band first excitation level $e_1$ (and the conduction band second excitation level $e_2$) exhibits strong absorption of light polarized in the direction perpendicular to the stacking direction of the quantum dot layers 41. For this, the photocurrent in the polarization direction perpendicular to the stacking direction is greater than the photocurrent in the polarization direction corresponding to the stacking direction. This is because light polarized in the in-plane direction is strongly absorbed due to the conduction band first excitation level $e_1$ and the conduction band second excitation level $e_2$ being quantum levels strongly affected by the size in the in-plane direction.

The photocurrent in the polarization direction perpendicular to the stacking direction of the quantum dot layers 41 can be compared with the photocurrent in the polarization direction corresponding to the stacking direction as follows: for example, polishing the substrate end surface of a sample such that the substrate end surface forms an angle of 45 degrees with respect to the stacking direction and causing light to strike the substrate end surface through a polarizing plate. More specifically, the photocurrent in the polarization direction perpendicular to the stacking direction of the quantum dot layers 41 is compared with the photocurrent in the polarization direction at 45 degrees with respect to the stacking direction. In the case where the photocurrent in the polarization direction perpendicular to the stacking direction is greater than the photocurrent in the polarization direction corresponding to the stacking direction, the photocurrent in the polarization direction perpendicular to the stacking direction will be greater than the photocurrent in the polarization direction at 45 degrees with respect to the stacking direction.

In the case of using transitions associated with strong absorption of light polarized in the stacking direction of the quantum dot layers 41, the surface incidence in an infrared detector normally results in a large drop in sensitivity. For this, it is desirable to control the polarization direction using diffraction grating or provide, for example, a structure in which light strikes the substrate end surface as described above, which leads to, for example, a large device and high costs.

Figure 5A:
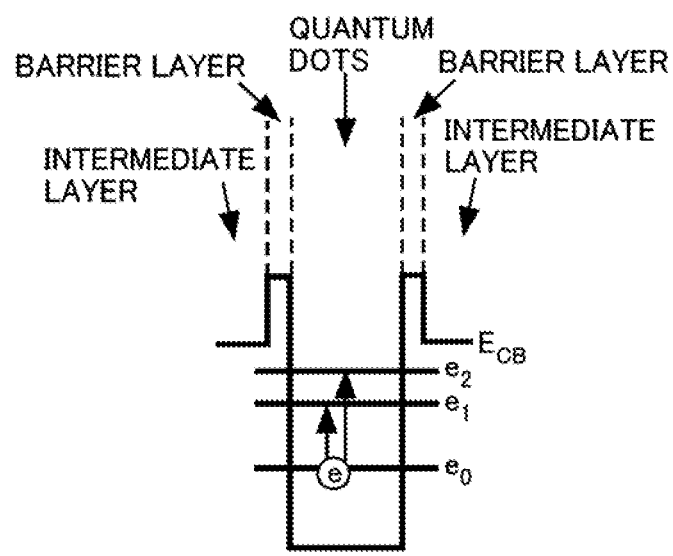
FIGS. 5A and 5B are schematic diagrams illustrating the energy levels of quantum dots, barrier layers (an underlayer and a partial capping layer), and an intermediate layer in a quantum dot layer.
Figure 5B:
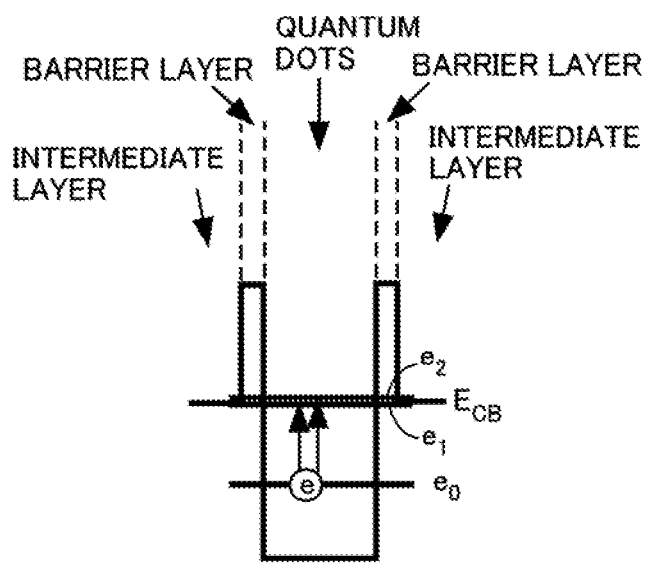

FIGS. 5A and 5B are schematic diagrams illustrating the energy levels of the quantum dots 411, the barrier layers (the underlayer 412 and the partial capping layer 414), and the intermediate layer 415 in the quantum dot layer 41.

FIG. 5A depicts the energy levels of quantum dots, a barrier layer, and an intermediate layer in an existing quantum dot layer. FIG. 5B depicts the energy levels of the quantum dots 411, the barrier layers (the underlayer 412 and the partial capping layer 414), and the intermediate layer 415 in the quantum dot layer 41 according to the embodiment of the present disclosure.

When the energy gap $E_{GAP3-2}$ between the conduction band second excitation level $e_2$ and the conduction band third excitation level $e_3$ among the conduction band first excitation level $e_1$, the conduction band second excitation level $e_2$, and the conduction band third excitation level $e_3$ in the quantum dots is much larger than an LO phonon energy of 36 meV, the conduction band first excitation level $e_1$ and the conduction band second excitation level $e_2$ are discrete and form quantum confinement levels (see FIG. 5A). The term "discrete" means that the energy gap is greater than thermal energy.

When the energy gap $E_{GAP3-2}$ between the conduction band second excitation level $e_2$ and the conduction band third excitation level $e_3$ is much smaller than an LO phonon energy of 36 meV, the conduction band first excitation level $e_1$ and the conduction band second excitation level $e_2$ are not discrete levels. This is because the conduction band first excitation level $e_1$ and the conduction band second excitation level $e_2$ are located near the conduction band bottom of the intermediate layer 415. The expression "the energy gap $E_{GAP3-2}$ is much smaller than an LO phonon energy of 36 meV" means that, for example, the energy gap $E_{GAP3-2}$ is much smaller than thermal energy (26 meV at room temperature).

In the quantum dot layer 41 according to the embodiment of the present disclosure, the conduction band first excitation level $e_1$ and the conduction band second excitation level $e_2$ form continuous-like states with the conduction band of the intermediate layer 415. The term "continuous-like states" means the states in which the conduction band first excitation level $e_1$ and the conduction band second excitation level $e_2$ interact with the continuous states of the conduction band of the intermediate layer 415; that is, the states in which the electron wave functions in the conduction band first excitation level $e_1$ and the conduction band second excitation level $e_2$ are present in both the quantum dots 411 and the conduction band of the intermediate layer 415.

The continuous-like states are achieved by forming the intermediate layer 415 using a material having the conduction band bottom of the intermediate layer 415 located near the conduction band first excitation level $e_1$ and the conduction band second excitation level $e_2$ and setting the thickness of the barrier layers (the underlayer 412 and the partial capping layer 414) to a thickness that allows for electron tunneling. The continuous-like states are achieved even without the barrier layers (the underlayer 412 and the partial capping layer 414) as long as the intermediate layer 415 is formed of a material having the conduction band bottom of the intermediate layer 415 located near the conduction band first excitation level $e_1$ and the conduction band second excitation level $e_2$.

In an existing quantum dot layer, the quantum confinement levels include the conduction band ground level $e_0$, the conduction band first excitation level $e_1$, and the conduction band second excitation level $e_2$, which are formed in the quantum dots. The conduction band first excitation level $e_1$ and the conduction band second excitation level $e_2$ do not form continuous-like states with the conduction band of the intermediate layer.

The quantum confinement levels of the quantum dot layer 41 according to the embodiment of the present disclosure include only the conduction band ground level $e_0$ among the conduction band ground level $e_0$, the conduction band first excitation level $e_1$, and the conduction band second excitation level $e_2$, which are formed in the quantum dots 411. The conduction band first excitation level $e_1$ and the conduction band second excitation level $e_2$ form continuous-like states with the conduction band of the intermediate layer 415.

The quantum dot layer 41 completely differs from an existing quantum dot layer.

In the quantum dot layer 41, the conduction band first excitation level $e_1$ and the conduction band second excitation level $e_2$ form continuous-like states with the conduction band of the intermediate layer 415. As a result, the emission peaks include a separated single peak from the conduction band ground level $e_0$ and a peak group including overlapped and successive peaks composed of a peak from the conduction band first excitation level $e_1$, a peak from the conduction band second excitation level $e_2$, and a peak from the conduction band of the intermediate layer 415. In other words, since the conduction band first excitation level $e_1$, the conduction band second excitation level $e_2$, and the conduction band of the intermediate layer 415 form continuous states, the emission peaks include a separated single peak from the conduction band ground level $e_0$ and a peak group including successive peaks from the conduction band first excitation level $e_1$, the conduction band second excitation level $e_2$, and the conduction band of the intermediate layer 415 that form continuous states. As a result, the absorption band (half-width) is not broad. This leads to high wavelength selectivity for photodetection.

Whether the conduction band first excitation level $e_1$ and the conduction band second excitation level $e_2$ form continuous-like states with the conduction band of the intermediate layer 415 is determined based on the emission characteristics of the quantum dot infrared detector 10. More specifically, in the case where the quantum confinement levels include only the conduction band ground level $e_0$ (see FIG. 5B), a separated single peak and a peak group including successively connected peaks appear. In the case where the quantum confinement levels include the conduction band first excitation level $e_1$ and the conduction band second excitation level $e_2$ (see FIG. 5A), a plurality of separated single peaks appears. Since two peaks from the conduction band first excitation level $e_1$ and the conduction band second excitation level $e_2$ in the embodiment of the present disclosure have similar energy values, these two peaks are successively connected in the spectrum. When a separated single peak and a group including successively connected peaks are detected as emission characteristics, it is then determined that the conduction band first excitation level $e_1$ and the conduction band second excitation level $e_2$ form continuous-like states with the conduction band of the intermediate layer 415. When a plurality of separated single peaks and a group including successively connected peaks are detected as emission characteristics, it is then determined that the conduction band first excitation level $e_1$ and the conduction band second excitation level $e_2$ do not form continuous-like states with the conduction band of the intermediate layer 415. The term "separated single peak" means that the energy gap between the single peak and an adjacent peak is much larger than thermal energy; that is, the single peak is not continuous with an adjacent peak.

The states in which the conduction band first excitation level $e_1$ and the conduction band second excitation level $e_2$ form continuous-like states with the conduction band of the intermediate layer 415 may be the states in which the emission peaks associated with the conduction band first excitation level $e_1$ or greater levels are continuous with that associated with the conduction band of the intermediate layer 415 and the emission peak associated with the conduction band ground level $e_0$ is distant from that associated with the conduction band by thermal energy or greater.

In the embodiment of the present disclosure, the continuous-like states are achieved by realizing any one of the following (A), (B), and (C).

(A) The energy gap between the conduction band first excitation level $e_1$ and the conduction band bottom of the intermediate layer 415 and the energy gap between the conduction band second excitation level $e_2$ and the conduction band bottom of the intermediate layer 415 are each smaller than twice thermal energy.

(B) The energy gap between the conduction band second excitation level $e_2$ and the conduction band third excitation level $e_3$ is smaller than thermal energy.

(C) The emission spectrum detected as a result of incidence of an electromagnetic wave on or injection of a current into the quantum dot infrared detector 10 includes a separated single peak and a peak group including successive peaks. The energy gap between the separated single peak and the peak group is larger than thermal energy. The energy gap between the peaks in the peak group is smaller than thermal energy.

In the foregoing description, the term "continuous-like states" are used for an easy understanding of the quantum dot infrared detector 10 according to the embodiment of the present disclosure. It is understood that the term "continuous-like states" are not used to determine the scope of the present disclosure. The scope of the present disclosure is determined based on the description of the claims, at which time the scope of the present disclosure is not determined in light of the meaning and context of the term "continuous-like states".

The structure of the quantum dot infrared detector 10 according to the embodiment of the present disclosure can be determined based on the emission spectra. Moreover, the structure of the quantum dot infrared detector 10 can be determined by analyzing the band structure based on the numerical calculations using the shape and composition of the quantum dots in the quantum dot structure and the thickness and composition of the underlayer for the quantum dots, the partial capping layer for the quantum dots, and the insertion layer.

Examples will be described below.

Example 1

A quantum dot infrared detector is produced in accordance with step (a) to step (g) illustrated in FIGS. 3A to 3E and FIGS. 4F and 4G. In this case, $Al_xGa_{1-x}As$ is used as a material of the intermediate layer 415, and x is varied in the range from 0 to 0.3.

Figure 6:
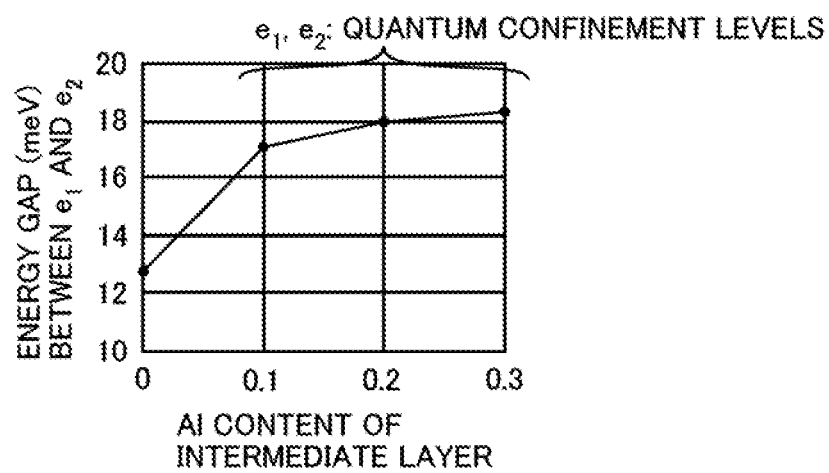
FIG. 6 is a graph illustrating the relationship between the Al content of the intermediate layer and the energy gap between a conduction band first excitation level $e_1$ and a conduction band second excitation level $e_2$.

FIG. 6 is a graph illustrating the relationship between the Al content of the intermediate layer 415 and the energy gap between the conduction band first excitation level $e_1$ and the conduction band second excitation level $e_2$.

In FIG. 6, the vertical axis represents the energy gap between the conduction band first excitation level $e_1$ and the conduction band second excitation level $e_2$, and the horizontal axis represents the Al content of the intermediate layer 415.

The results in FIG. 6 are calculation results, and the calculation conditions are as described below.

The quantum dots 411 and the wetting layer 413 are formed of InAs. The barrier layers (the underlayer 412 and the partial capping layer 414) are formed of $Al_{0.4}Ga_{0.6}As$. The intermediate layer 415 is formed of $Al_xGa_{1-x}As$ (x=0, 0.1, 0.2, 0.3). The quantum dot 411 has a pyramid shape. In consideration of 10% in-plane size anisotropy, the size in the [110] direction is 18 nm, and the size in the [1-10] direction is 10% larger than that in the [110] direction. The height of the quantum dots 411 is 4 nm. The thickness of the wetting layer 413 is 0.5 nm, and the thickness of the barrier layers (the underlayer 412 and the partial capping layer 414) is 1 nm. The calculation method uses a single band.

Referring to FIG. 6, the energy gap $E_{GAP1-2}$ between the conduction band first excitation level $e_1$ and the conduction band second excitation level $e_2$ is the smallest when the Al content of the intermediate layer 415 is "0". The energy gap $E_{GAP1-2}$ increases as the Al content of the intermediate layer 415 increases.

When the Al content of the intermediate layer 415 is "0", the energy positions of the conduction band first excitation level $e_1$ and the conduction band second excitation level $e_2$ are located near the conduction band bottom of the intermediate layer 415. As a result, the conduction band first excitation level $e_1$ and the conduction band second excitation level $e_2$ are less discretized, and the energy gap $E_{GAP1-2}$ between the conduction band first excitation level $e_1$ and the conduction band second excitation level $e_2$ is small. Therefore, the conduction band first excitation level $e_1$ and the conduction band second excitation level $e_2$ are in continuous states, which improves wavelength selectivity for photodetection.

Whether the conduction band first excitation level $e_1$ and the conduction band second excitation level $e_2$ form discrete quantum confinement levels is determined based on the energy gap $E_{GAP2-3}$ between the conduction band second excitation level $e_2$ and the conduction band third excitation level $e_3$.

When the energy gap $E_{GAP2-3}$ is much larger than an LO phonon energy of 36 meV, the conduction band first excitation level $e_1$ and the conduction band second excitation level $e_2$ form discrete quantum confinement levels (see FIG. 5A).

When the energy gap $E_{GAP2-3}$ is much smaller than an LO phonon energy of 36 meV, the conduction band first excitation level $e_1$ and the conduction band second excitation level $e_2$ are not discrete levels (see FIG. 5B). This is because the energy positions of the conduction band first excitation level $e_1$ and the conduction band second excitation level $e_2$ are located near the conduction band bottom of the intermediate layer 415.

(1) Case where Al Content x of Intermediate Layer 415 is 0.3

In this case, the energy gap $E_{GAP2-3}$ is 78 meV, which is much larger than an LO phonon energy of 36 meV. As a result, the conduction band first excitation level $e_1$ and the conduction band second excitation level $e_2$ form discrete quantum confinement levels (see FIG. 5A).

(2) Case where Al Content x of Intermediate Layer 415 is 0.2

In this case, the energy gap $E_{GAP2-3}$ is 76 meV, which is much larger than an LO phonon energy of 36 meV. As a result, the conduction band first excitation level $e_1$ and the conduction band second excitation level $e_2$ form discrete quantum confinement levels (see FIG. 5A).

(3) Case where Al Content x of Intermediate Layer 415 is 0.1

In this case, the energy gap $E_{GAP2-3}$ is 70 meV, which is much larger than an LO phonon energy of 36 meV. As a result, the conduction band first excitation level $e_1$ and the conduction band second excitation level $e_2$ form discrete quantum confinement levels (see FIG. 5A).

(4) Case where Al Content x of Intermediate Layer 415 is 0

In this case, the energy gap $E_{GAP2-3}$ is 8 meV, which is much smaller than an LO phonon energy of 36 meV. As a result, the conduction band first excitation level $e_1$ and the conduction band second excitation level $e_2$ are not discrete levels (see FIG. 5B).

As illustrated in FIG. 6, in the case where the Al content x of the intermediate layer 415 is 0.1, 0.2, and 0.3, the conduction band first excitation level $e_1$ and the conduction band second excitation level $e_2$ form discrete quantum confinement levels. In the case where the Al content x of the intermediate layer 415 is 0, the conduction band first excitation level $e_1$ and the conduction band second excitation level $e_2$ are not discrete levels.

A quantum dot infrared detector in which the Al content x of the intermediate layer 415 is 0 is defined as a quantum dot infrared detector of Example 1. Quantum dot infrared detectors in which the Al content x of the intermediate layer 415 is 0.1, 0.2, and 0.3 are defined as quantum dot infrared detectors of Comparative Examples 1, 2, and 3, respectively.

Figure 7A:
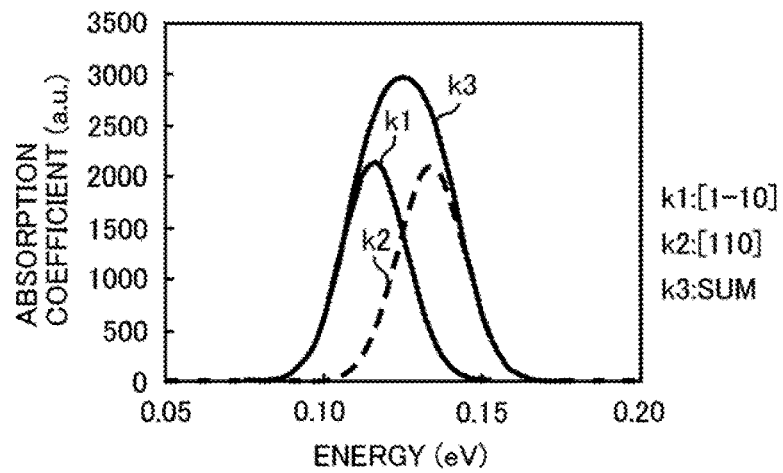
FIGS. 7A and 7B are graphs illustrating the absorption spectra.
Figure 7B:
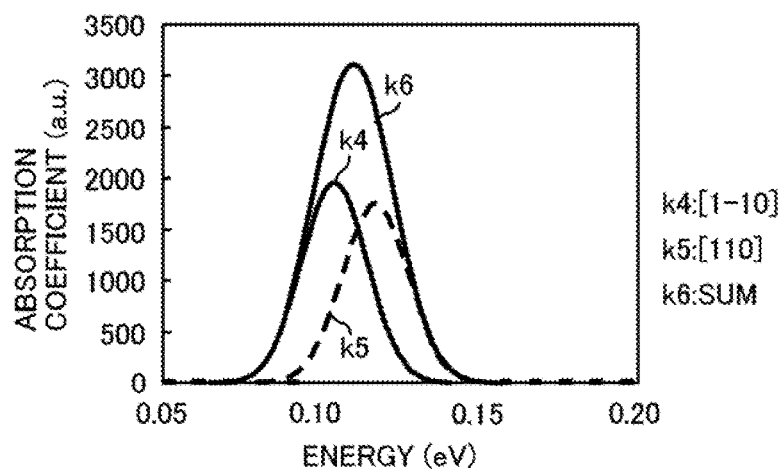

FIGS. 7A and 7B are graphs illustrating the absorption spectra. In FIGS. 7A and 7B, the vertical axis represents absorption coefficient and the horizontal axis represents energy. The curve k1 indicates the absorption spectrum in the [1-10] polarization direction (the same direction as the crystal axis of the quantum dot 411). The curve k2 indicates the absorption spectrum in the [110]polarization direction. The curve k3 indicates the sum of these two absorption spectra. The curve k4 indicates the absorption spectrum in the [1-10] polarization direction (the same direction as the crystal axis of the quantum dot 411). The curve k5 indicates the absorption spectrum in the [110] polarization direction. The curve k6 indicates the sum of these two absorption spectra.

Referring to FIG. 7A, in Comparative Example 2 where the Al content x of the intermediate layer 415 is 0.2, the absorption peaks of polarized light are observed at 115 meV (10.8 μm) and 133 meV (9.3 μm), and the energy gap between the absorption peaks is 18 meV. The energy gap of 18 meV corresponds to the energy gap $E_{GAP1-2}$ between the conduction band first excitation level $e_1$ and the conduction band second excitation level $e_2$ when the Al content of the intermediate layer 415 is 0.2 in FIG. 6.

Referring to FIG. 7B, in Example 1 where the Al content x of the intermediate layer 415 is 0, the absorption peaks of polarized light are observed at 103 meV (12.0 μm) and 116 meV (10.7 μm), and the energy gap between the absorption peaks is 13 meV. The energy gap of 13 meV corresponds to the energy gap $E_{GAP1-2}$ between the conduction band first excitation level $e_1$ and the conduction band second excitation level $e_2$ when the Al content of the intermediate layer 415 is 0 in FIG. 6.

Therefore, the half-width of the detection band in FIG. 7B is reduced to about 30 meV from about 36 meV in FIG. 7A. In other words, the quantum dot infrared detector of Example 1 has a narrower half-width of the detection band than the quantum dot infrared detector of Comparative Example 2.

For the quantum dot infrared detector of Example 1, overlapped absorption spectra of polarized light results in a large maximum absorption coefficient in the sum of the absorption spectra. This corresponds to the sensitivity characteristic during normal sensor use (unpolarized light) and means high peak sensitivity. Therefore, the peak sensitivity can be improved.

Example 2

Figure 8:
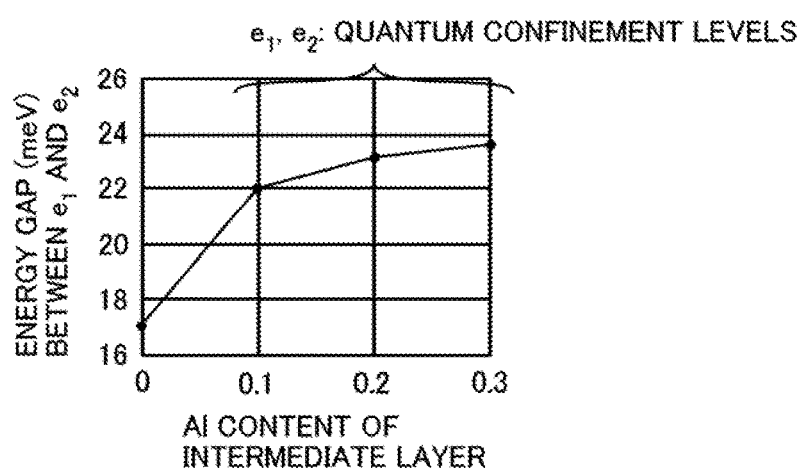
FIG. 8 is a graph illustrating the relationship between the Al content of the intermediate layer and the energy gap between a conduction band first excitation level $e_1$ and a conduction band second excitation level $e_2$.

FIG. 8 is a graph illustrating the relationship between the Al content of the intermediate layer 415 and the energy gap between a conduction band first excitation level $e_1$ and a conduction band second excitation level $e_2$.

In FIG. 8, the vertical axis represents the energy gap between the conduction band first excitation level $e_1$ and the conduction band second excitation level $e_2$, and the horizontal axis represents the Al content of the intermediate layer 415.

The calculation results depicted in FIG. 8 are obtained by calculation using the same calculation conditions as those in Example 1 except that, regarding the in-plane size anisotropy of the quantum dots 411, the size in the [1-10] direction is 15% larger than that in the [110] direction.

Referring to FIG. 8, the energy gap $E_{GAP1-2}$ between the conduction band first excitation level $e_1$ and the conduction band second excitation level $e_2$ has substantially the same relationship with the Al content of the intermediate layer 415 as in Example 1.

In Example 1, when the Al content of the intermediate layer 415 varies from 0.3 to 0, a change in the energy gap $E_{GAP1-2}$ between the conduction band first excitation level $e_1$ and the conduction band second excitation level $e_2$ is 5 meV. When the Al content of the intermediate layer 415 varies from 0.1 to 0, a change in the energy gap $E_{GAP1-2}$ between the conduction band first excitation level $e_1$ and the conduction band second excitation level $e_2$ is 4 meV.

In Example 2, when the Al content of the intermediate layer 415 varies from 0.3 to 0, a change in the energy gap $E_{GAP1-2}$ between the conduction band first excitation level $e_1$ and the conduction band second excitation level $e_2$ is 7 meV. When the Al content of the intermediate layer 415 varies from 0.1 to 0, a change in the energy gap $E_{GAP1-2}$ between the conduction band first excitation level $e_1$ and the conduction band second excitation level $e_2$ is 5 meV.

This is because a difference in the energy gap $E_{GAP1-2}$ between the conduction band first excitation level $e_1$ and the conduction band second excitation level $e_2$ increases as the in-plane size anisotropy of the quantum dots increases. The effect of the embodiment of the present disclosure becomes more marked.

In Example 2, whether the conduction band first excitation level $e_1$ and the conduction band second excitation level $e_2$ form discrete quantum confinement levels is also determined based on the energy gap $E_{GAP2-3}$ between the conduction band second excitation level $e_2$ and the conduction band third excitation level $e_3$.

(5) Case where Al Content x of Intermediate Layer 415 is 0.3
In this case, the energy gap $E_{GAP2-3}$ is 67 meV, which is much larger than an LO phonon energy of 36 meV. As a result, the conduction band first excitation level $e_1$ and the conduction band second excitation level $e_2$ form discrete quantum confinement levels (see FIG. 5A).

(6) Case where Al Content x of Intermediate Layer 415 is 0.2
In this case, the energy gap $E_{PAP2-3}$ is 72 meV, which is much larger than an LO phonon energy of 36 meV. As a result, the conduction band first excitation level $e_1$ and the conduction band second excitation level $e_2$ form discrete quantum confinement levels (see FIG. 5A).

(7) Case where Al Content x of Intermediate Layer 415 is 0.1
In this case, the energy gap $E_{GAP2-3}$ is 75 meV, which is much larger than an LO phonon energy of 36 meV. As a result, the conduction band first excitation level $e_1$ and the conduction band second excitation level $e_2$ form discrete quantum confinement levels (see FIG. 5A).

(8) Case where Al Content x of Intermediate Layer 415 is 0
In this case, the energy gap $E_{GAP2-3}$ is 9 meV, which is much smaller than an LO phonon energy of 36 meV. As a result, the conduction band first excitation level $e_1$ and the conduction band second excitation level $e_2$ are not discrete levels (see FIG. 5B).

As illustrated in FIG. 8, in the case where the Al content x of the intermediate layer 415 is 0.1, 0.2, and 0.3, the conduction band first excitation level $e_1$ and the conduction band second excitation level $e_2$ form discrete quantum confinement levels. In the case where the Al content x of the intermediate layer 415 is 0, the conduction band first excitation level $e_1$ and the conduction band second excitation level $e_2$ are not discrete levels.

A quantum dot infrared detector in which the Al content x of the intermediate layer 415 is 0 is defined as a quantum dot infrared detector of Example 2. Quantum dot infrared detectors in which the Al content x of the intermediate layer 415 is 0.1, 0.2, and 0.3 are defined as quantum dot infrared detectors of Comparative Examples 4, 5, and 6, respectively.

The quantum dot infrared detector of Example 2 is produced in the same manner as the quantum dot infrared detector of Example 1 except that the percentage of in-plane size anisotropy of the quantum dot 411 is changed to 15%, that is, the size in the [110] direction is 18 nm, and the size in the [1-10] direction is 15% larger than that in the [110] direction.

The quantum dot infrared detectors of Comparative Examples 4, 5, and 6 are produced in the same manner as the quantum dot infrared detectors of Comparative Examples 1, 2, and 3 except that the size in the [110] direction is 18 nm, and the size in the [1-10] direction is 15% larger than that in the [110] direction.

Figure 9A:
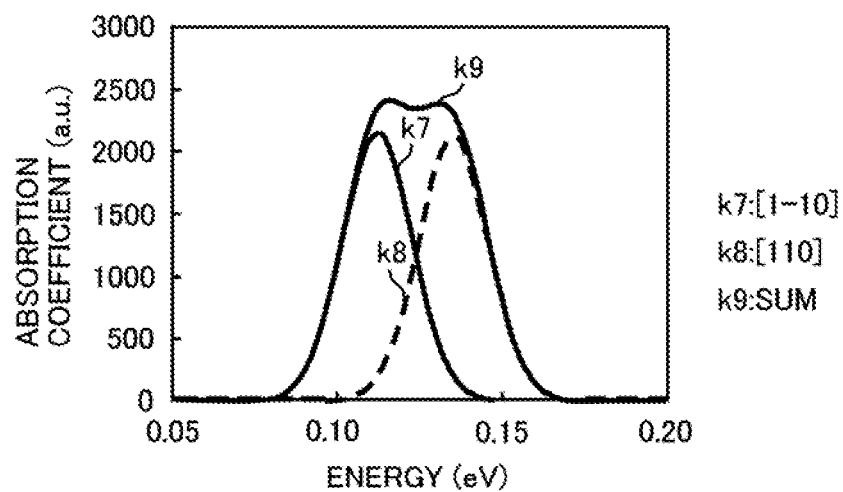
FIGS. 9A and 9B are graphs illustrating the absorption spectra.
Figure 9B:
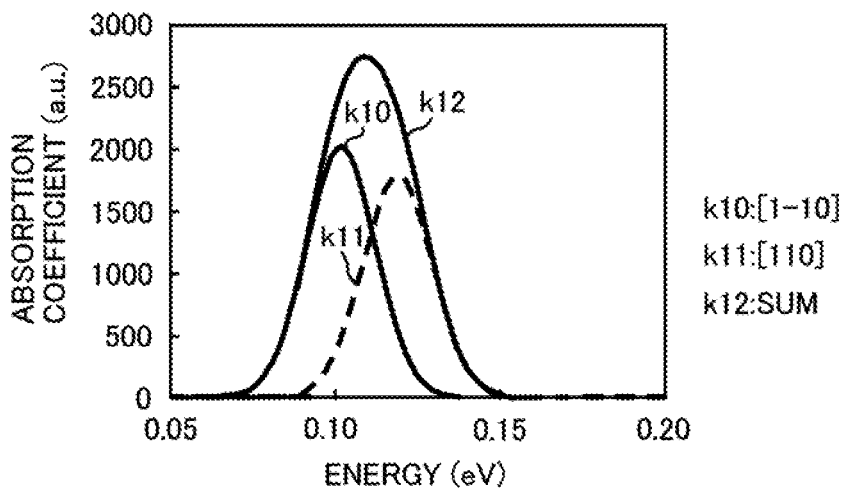

FIGS. 9A and 9B are graphs illustrating the absorption spectra. In FIGS. 9A and 9B, the vertical axis represents absorption coefficient and the horizontal axis represents energy. The curve k7 indicates the absorption spectrum in the [1-10] polarization direction (the same direction as the crystal axis of the quantum dot 411). The curve k8 indicates the absorption spectrum in the [110] polarization direction. The curve k9 indicates the sum of these two absorption spectra. The curve k10 indicates the absorption spectrum in the [1-10] polarization direction (the same direction as the crystal axis of the quantum dot 411). The curve k11 indicates the absorption spectrum in the [110] polarization direction. The curve k12 indicates the sum of these two absorption spectra.

Referring to FIG. 9A, in Comparative Example 5 where the Al content x of the intermediate layer 415 is 0.2, the absorption peaks of polarized light are observed at 110 meV (11.2 μm) and 133 meV (9.3 μm), and the energy gap between the absorption peaks is 23 meV. The energy gap of 23 meV corresponds to the energy gap $E_{GAP1-2}$ between the conduction band first excitation level $e_1$ and the conduction band second excitation level $e_2$ when the Al content of the intermediate layer 415 is 0.2 in FIG. 8.

Referring to FIG. 9B, in Comparative Example 2 where the Al content x of the intermediate layer 415 is 0, the absorption peaks of polarized light are observed at 100 meV (12.3 μm) and 117 meV (10.5 μm), and the energy gap between the absorption peaks is 17 meV. The energy gap of 17 meV corresponds to the energy gap $E_{GAP1-2}$ between the conduction band first excitation level $e_1$ and the conduction band second excitation level $e_2$ when the Al content of the intermediate layer 415 is 0 in FIG. 8.

Therefore, the half-width of the detection band in FIG. 9B is reduced to about 35 meV from about 46 meV in FIG. 9A. In other words, the quantum dot infrared detector of Comparative Example 2 has a narrower half-width of the detection band than the quantum dot infrared detector of Comparative Example 5.

For the quantum dot infrared detector of Example 2, overlapped absorption spectra of polarized light results in a large maximum absorption coefficient in the sum of the absorption spectra. This corresponds to the sensitivity characteristic during normal sensor use (unpolarized light) and means high peak sensitivity. Therefore, the peak sensitivity can be improved.

In the quantum dot infrared detector of Example 2, the conduction band first excitation level $e_1$ and the conduction band second excitation level $e_2$ form continuous-like states with the conduction band of the intermediate layer 415, and the quantum confinement levels include only the conduction band ground level $e_0$. In the quantum dot infrared detectors of Comparative Examples 4, 5, and 6, the conduction band first excitation level $e_1$ and the conduction band second excitation level $e_2$ are discrete levels.

Therefore, the quantum dot infrared detector of Example 2 has a narrower half-width of the detection band than the quantum dot infrared detectors of Comparative Examples 4, 5, and 6.

In the foregoing embodiments, a quantum dot infrared detector according to an embodiment of the present disclosure includes a quantum dot-stacked structure that includes quantum dot layers stacked on top of one another and each including quantum dots and an intermediate layer.

The quantum dots have conduction band quantum confinement levels that include a conduction band ground level, a conduction band first excitation level at a higher energy position than the conduction band ground level, and a conduction band second excitation level at a higher energy position than the conduction band ground level. An energy gap between the conduction band first excitation level and a conduction band bottom of the intermediate layer and an energy gap between the conduction band second excitation level and the conduction band bottom of the intermediate layer are each smaller than twice thermal energy. The conduction band ground level and the conduction band first excitation level are discrete levels.

When the energy gap between the conduction band first excitation level and the conduction band bottom of the intermediate layer and the energy gap between the conduction band second excitation level and the conduction band bottom of the intermediate layer are each smaller than twice thermal energy, the continuous-like states are achieved, and the half-width for photodetection in the 8-14 μm band can be reduced.

A quantum dot infrared detector according to an embodiment of the present disclosure includes a quantum dot-stacked structure in which quantum dot layers containing quantum dots are stacked on top of one another.

The quantum dots have conduction band quantum confinement levels that include a conduction band ground level, and a conduction band first excitation level, a conduction band second excitation level, and a conduction band third excitation level each at a higher energy position than the conduction band ground level. An energy gap between the conduction band second excitation level and the conduction band third excitation level is smaller than thermal energy. The conduction band ground level and the conduction band first excitation level are discrete levels.

When the energy gap between the conduction band second excitation level and the conduction band third excitation level is smaller than thermal energy, the continuous-like states are achieved, and the half-width for photodetection in the 8-14 μm band can be reduced.

Moreover, a quantum dot infrared detector according to an embodiment of the present disclosure includes a quantum dot-stacked structure that includes quantum dot layers stacked on top of one another and each including quantum dots.

The quantum dots have conduction band quantum confinement levels that include a conduction band ground level and a conduction band first excitation level at a higher energy level than the conduction band ground level. The conduction band ground level and the conduction band first excitation level are discrete levels.

An emission spectrum detected as a result of incidence of an electromagnetic wave on or injection of a current into the quantum dot infrared detector includes a separated single peak and a peak group including successive peaks; an energy gap between the separated single peak and the peak group is larger than thermal energy; and an energy gap between the peaks in the peak group is smaller than thermal energy.

When the energy gap between the separated single peak and the peak group is larger than thermal energy and the energy gap between the peaks in the peak group is smaller than thermal energy, the continuous-like states are achieved, and the half-width for photodetection in the 8-14 μm band can be reduced.

The embodiments disclosed herein are for illustrative purposes in any respect and should not be construed as limiting. The scope of the present disclosure is defined by the claims rather than the description of the embodiments and is intended to include any modifications within the meaning and range of equivalency of the claims.

INDUSTRIAL APPLICABILITY

The present disclosure is applied to quantum dot infrared detectors.

The present disclosure contains subject matter related to that disclosed in Japanese Priority Patent Application JP 2017-169697 filed in the Japan Patent Office on Sep. 4, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A quantum dot infrared detector comprising:
   a quantum dot-stacked structure that includes quantum dot layers stacked on top of one another and each including quantum dots and an intermediate layer,
   wherein the quantum dots have conduction band quantum confinement levels that include a conduction band ground level, a conduction band first excitation level at a higher energy position than the conduction band ground level, and a conduction band second excitation level at a higher energy position than the conduction band ground level, wherein an energy gap between the conduction band first excitation level and a conduction band bottom of the intermediate layer and an energy gap between the conduction band second excitation level and the conduction band bottom of the intermediate layer are each smaller than twice thermal energy, wherein the conduction band ground level and the conduction band first excitation level are discrete levels, wherein the intermediate layer is a layer serving as a matrix of the quantum dot layers and formed of a semiconductor material having a larger bandgap than the semiconductor material constituting the quantum dots, wherein each of the quantum dot layers further includes a barrier layer for the quantum dots.

2. The quantum dot infrared detector according to claim 1, wherein each of the quantum dot layers further includes another intermediate layer, and the quantum dots are sandwiched between the intermediate layers in a height direction of the quantum dots.

3. The quantum dot infrared detector according to claim 1, wherein the quantum confinement levels include only the conduction band ground level.

4. The quantum dot infrared detector according to claim 1, wherein the barrier layer is formed of $Al_xGa_{1-x}As$ ($0<x\leq1$).

5. The quantum dot infrared detector according to claim 1, wherein the intermediate layer is formed of GaAs.

6. The quantum dot infrared detector according to claim 1, wherein a photocurrent in a polarization direction perpendicular to a stacking direction of the quantum dots is larger than a photocurrent in a polarization direction corresponding to the stacking direction.

* * * * *